United States Patent [19]

Ma

[11] 3,980,968
[45] Sept. 14, 1976

[54] NON-PROPORTIONATE AFC SYSTEM
[75] Inventor: John Y. Ma, Glenview, Ill.
[73] Assignee: Zenith Radio Corporation, Chicago, Ill.
[22] Filed: Jan. 2, 1975
[21] Appl. No.: 538,222

[52] U.S. Cl.................................. 331/17; 331/16; 331/1 A; 331/36 C; 325/422; 334/15
[51] Int. Cl.².......................................... H03B 3/04
[58] Field of Search ................... 331/1 A, 16, 8, 17, 331/36 C, 177 V; 334/15; 325/422

[56] References Cited
UNITED STATES PATENTS

| | | | |
|---|---|---|---|
| 3,538,450 | 11/1970 | Andrea et al. | 331/36 C |
| 3,697,885 | 10/1972 | Avins | 331/36 C |
| 3,701,039 | 10/1972 | Lang | 331/1 A |
| 3,753,172 | 8/1973 | Sakamoto | 331/36 C |
| 3,784,917 | 1/1974 | Kenyon | 331/36 C |
| 3,806,827 | 4/1974 | Standke | 331/8 |
| 3,869,674 | 3/1975 | Borbely | 325/422 |

Primary Examiner—John Kominski
Attorney, Agent, or Firm—Joseph T. Downey; Nicholas A. Camasto

[57] ABSTRACT

A television tuning system has a ramp voltage source including an electrical current source and an electrical current sink coupled through selectively operable transmission gates for varying the voltage of a tuning capacitor to control a local oscillator for tuning independent of received signal. The local oscillator signal is mixed with a received signal to produce an intermediate frequency signal which is amplified in an IF amplifier. A frequency detector is coupled to the IF amplifier and produces an error signal dependent upon the frequency difference between a reference frequency and the IF signal. An additional current source and sink are coupled to the tuning capacitor through transmission gates controlled by the error signals. Differences greater than a predetermined amount selectively activate the latter transmission gates to provide substantially constant magnitude tuning voltage corrections irrespective of the amount of the difference.

7 Claims, 1 Drawing Figure

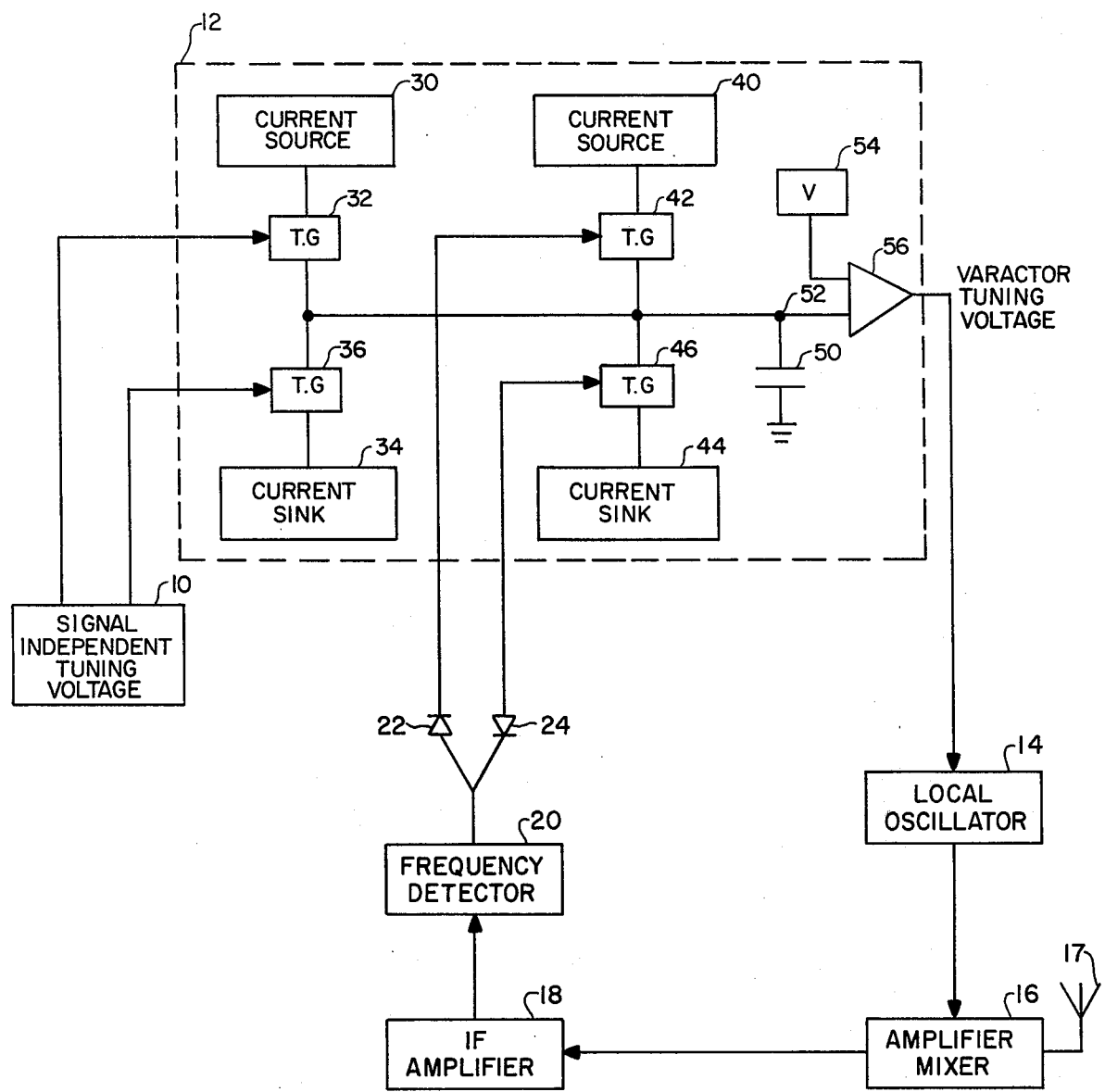

NON-PROPORTIONATE AFC SYSTEM

BACKGROUND OF THE INVENTION

Automatic frequency control (AFC) systems function to frequency stabilize a source of RF energy or to maintain a frequency relationship between sources of RF energy. Generally, a difference frequency, obtained by mixing two signals, is maintained at a constant value irrespective of the absolute stability of either signal source. Many AFC systems are used with superheterodyne type television receivers and operate by controlling the frequency of the local oscillator in the receiver. Such systems operate on the received signal and can function only after the receiver has been approximately tuned to an incoming signal by some other means. There is generally a frequency detector for producing an error voltage which is proportional to the difference between the developed IF (difference) frequency and a predetermined reference frequency. The error voltage is supplied to a control circuit to change the local oscillator frequency in the correct direction to reduce the error voltage. There must always be a small error or "offset" to provide a correction voltage, but the magnitude of error required may be decreased by increasing the amplification of the AFC loop.

Two criteria for AFC systems are pull-in range and hold-in range. Assuming the proper signal-independent setting of the local oscillator frequency, the pull-in range is the maximum frequency differential for which the system will move the local oscillator frequency to tune the receiver to the incoming frequency. The hold-in range is normally larger and is the maximum frequency differential between the oscillator and incoming signal for which the AFC system will maintain tuning, barring interruptions of the signal.

An additional criterion for AFC systems is the pull-in ratio which is the ratio of the frequency movement or displacement to the frequency differential remaining after the AFC system has acted. For example, if the received signal frequency is 500 KHz away from the oscillator frequency, an AFC system with a pull-in ratio of 10 to 1 (normal for television receivers) would move the oscillator tuning frequency to within 50 KHz of the received signal.

As mentioned, conventional AFC systems can never tune the oscillator exactly to the incoming signal and a small offset error always remains. The magnitude of the offset error can be diminished by increasing the loop gain but this may well be at a loss of stability in the tuning system. Likewise, the pull-in ratio for a conventional AFC system is limited by the gain of the AFC loop.

In an AFC system for a varactor diode tuner a separate correction voltage is added to the tuning voltage supplied by the approximate, or coarse, tuning source to achieve tuning control. There is a time delay between detection of the received signal and the application of the correction voltage. With a normal AFC system, "overshoot" can occur in which the AFC system drives the oscillator past the correct frequency. The detector then responds by reversing the voltage correction in an effort to drive the oscillator back. If the loop gain is very high an oscillatory condition can result. Therefore, achieving very high pull-in ratios by increasing AFC loop gain is normally not practical.

In conventional AFC systems the magnitude of the correction voltage is proportional to the frequency error detected, and the control voltage is added to the coarse or signal-independent tuning voltage. U.S. Pat. No. 3,697,885 to Avins describes a varactor tuning system in which a variable DC voltage provides coarse tuning. A correction DC voltage is also supplied by a frequency discriminator circuit. It should be observed that the correction voltage may be plus or minus depending upon the direction of the deviation of the IF signal and reference frequency in the discriminator. The specific AFC error signal is converted into a current which is injected into a voltage driver for equalizing the AFC loop gain over the receiver tuning range. The need for loop gain control results from the combining of separate DC voltages for tuning.

The signal-tracking means of the present invention employ a digital control concept to an AFC system. With it normal frequency detection apparatus may be used to reduce the oscillator offset error to zero. Rather than providing a separate additive correction voltage, the signal-independent tuning voltage itself is adjusted by supplying increments of charge to a tuning voltage capacitor. Thus, within the limits of device activation voltage limits, the oscillator frequency is brought into precise tuning relationship with the received signal. In this condition the signal tracking means is inoperative and uses no power, which is an added advantage.

Since the circuit embodying this invention exhibits two states, that is, it is either operating to cause tuning to within a narrow frequency difference between the IF signal frequency and reference frequency or it is inoperative, it does not exhibit a holding range in the normal sense of the term. It has rather a frequency deviation threshold beyond which it operates to bring the oscillator tuning to a point within the frequency deviation threshold region. If either the received signal or the oscillator results in a-greater-than-threshold difference between the IF and reference frequencies, the system is activated. The pull-in range for the signal tracking means of the invention may be quite similar to that for AFC systems since it uses conventional circuitry.

A distinguishing characteristic of the AFC or signal tracking system of the present invention lies in the fact that the concept of a pull-in ratio is inappropriate. For any given displacement a pull-in ratio value could be determined but this is not a parameter which characterizes the operation of the system, since, were it not for device activation voltage limits, the oscillator would be brought to its precise frequency every time. For any displacement up to the maximum pull-in range the signal tracking system of the invention will tune the oscillator to a narrow offset region defined by device deviation limits. The maximum pull-in ratio would be derived from the quotient of the pull-in frequency range divided by the narrow tuning range. This value would far exceed the stable pull-in ratio which could be achieved by increasing loop gain in a conventional AFC system.

As an example of the magnitude of the narrow offset frequency region for an embodiment of this invention, consider a frequency detector having a sensitivity of 30 volts per MHz, steering diodes having activation potentials of 0.5 volts and a pull-in range greater than 1 MHz. The corresponding offset frequency region assuming linearly in the operational region would be in the ratio of one volt (the sum of the diode activation potentials) to 30 volts which corresponds to approximately 0.33

MHz. Within the pull-in range of the system, this would mean that control can be achieved and tuning corrected to a region which is plus or minus 16.5 KHz on either side of the original undisplaced signal regardless of the magnitude of displacement.

OBJECTS OF THE INVENTION

An object of this invention is to provide an improved television tuning system.

Another object of this invention is to provide an improved automatic frequency control system for a television tuning system.

SUMMARY OF THE INVENTION

A television tuning system includes a variable frequency local oscillator, means determining the frequency of the oscillator independent of broadcast television signals, mixing means mixing the local oscillator signal with a received television signal to produce an IF signal, an IF amplifier and tuning control means for said local oscillator. The oscillator is brought to proper frequency relationship with a received signal by signal tracking automatic frequency control means including a detector coupled between the IF amplifier and the tuning control means which develops an error signal as a function of the frequency difference between the IF signal and a reference frequency. The error signal control means in said control means supply a substantially constant magnitude corrections to the oscillator.

BRIEF DESCRIPTION OF THE DRAWING

The single drawing depicts in combined block and schematic form a television tuning system incorporating the invention. Referring to the drawing, dashed line block 12 indicates a tuning control arrangement for supplying DC tuning voltages to a varactor diode controlled local oscillator. Specifically, block 12 comprises a plurality of transmission gates controlling addition or removal of charge from a tuning capacitor and hence serves as a ramp voltage generator.

A signal independent tuning voltage source 10 is coupled to a pair of transmission gates 32 and 36 in block 12 to develop a "coarse" or approximate tuning voltage on a tuning capacitor 50 for tuning a local oscillator 14. An example of such a signal independent tuning voltage source may be found in copending application Ser. No. 430,446, filed Jan. 3, 1974 entitled Channel Seeking Tuning System. Local oscillator 14 supplies a signal to an amplifier-mixer arrangement 16 which mixes that signal with broadcast television signals received from an antenna 17. The output of amplifier-mixer 16 is an intermediate frequency (IF) signal which is supplied to an IF amplifier 18. IF amplifier 18 increases the IF signal amplitude and supplied it to a frequency detector 20. Frequency detector 20 may be a conventional double-tuned resonant circuit which has been previously aligned to respond to variations about a selected or reference value of intermediate frequency signal. Its output voltage level and polarity are directly dependent upon the direction and amount of the difference between the IF signal frequency and the reference frequency. The output of frequency detector 20 is supplied to a pair of steering diodes 22 and 24 whose outputs are respectively coupled to transmission gates 42 and 46 in tuning control 12. Thus, the tuning control system includes a signal independent and signal responsive control means operating on the same tuning voltage means.

Transmission gates, 32, 36, 42 and 46 are connected to one side of tuning capacitor 50, the other terminal of which is connected to ground. A current source 30 (through transmission gate 32) and a current sink 34 (through transmission gate 36) control charging and discharging of tuning capacitor 50. In a similar manner, current source 40 and current sink 44 are coupled through transmission gates 42 and 46, respectively, to vary the voltage on tuning capacitor 50. The current sources and sinks, through their respective transmission gates, change the charge level on tuning capacitor 50, which varies the tuning voltage correspondingly. Tuning capacitor 50 is coupled to an input of an operational amplifier 56 which has a second input connected to a voltage source 54. Operational amplifier 56 amplifies the level of the tuning voltage for application to oscillator 14. The signal-independent tuning voltage may be produced by any conventional arrangement such as a switchable potentiometer, or an electronic channel computer as set out in the above-mentioned copending application. In any case the oscillator is tuned to a coarse frequency adjustment by selectively activating transmission gates 32 and 36.

Frequency detector 20 is coupled through steering diodes 22 and 24 to selectively activate transmission gates 42 and 46, respectively, depending upon whether the frequency of the IF signal is greater than or less than the IF reference frequency. If it is less than the reference, indicating the need for an increase in tuning voltage, steering diode 22 is driven conductive to activate transmission gate 42 and current source 40 supplies additional charge to tuning capacitor 50 for increasing the tuning voltage. Similarly, if the oscillator frequency is high, steering diode 24 is driven conductive to activate transmission gate 46, which enables current sink 44 to remove charge from capacitor 50, thereby reducing the tuning voltage.

Note that, while charge is supplied or removed from tuning capacitor 50, dependent upon the algebraic sign of the difference between the IF and reference frequency and during tuning correction, the amount of charge transferred is independent of the magnitude of the difference or error signal developed by detector 20. Thus, the tuning voltage change is not proportional to the error signal magnitude. This is a distinguishing feature of the invention, namely, the non-proportionality between the tuning voltage correction and the error signal. Detector 20 responds to any detectable frequency difference to produce a corresponding error signal. The error signals are, however, coupled to the transmission gates through steering diodes which exhibit contact potentials requiring some minimum activation voltage. Moreover, the transmission gates may also have a minimum activation voltage. Therefore, there may be a small threshold frequency differential below which the error signals are insufficient to initiate a corrective response in tuning control 12. Because of this threshold there may be a slight frequency differential between the IF signal and reference frequency.

Thus, any offset frequency in the system of the invention is a result of the above-mentioned activation voltages and not, as in the prior art, a result of the AFC system requiring an error voltage to hold the oscillator tuning. With the system of the invention the correction voltage generation apparatus is cooperative for frequency differentials less than the threshold.

What has been shown is a novel automatic frequency control device which permits exact tuning by employing a conventional automatic frequency detector coupled through means which permit response only when an error signal is greater than a threshold value. A correction signal which is non-proportionate to the magnitude of the detected error signal is then produced until the tuning returns to within a narrow frequency region. This provides stable and accurate tuning correction regardless of the magnitude of signal displacement.

While a particular embodiment of the present invention has been shown and described, it will be obvious to those skilled in the art that various changes and modifications may be made without departing from the invention in its broader aspects. The aim in the appended claims is to cover all such changes and modifications as may fall within the true spirit and scope of the invention.

What is claimed is:

1. In a television tuning system including a variable frequency local oscillator, means determining the frequency of said local oscillator independently of broadcast television signals, mixing means mixing the local oscillator signal with a received television signal to produce an IF signal, an IF signal amplifier and tuning control means for said local oscillator, received signal tracking means comprising:
    detector means coupled between said IF amplifier and said tuning control means for developing an error signal as a function of the frequency difference between said IF signal and a reference frequency, and means in said tuning control means for producing a constant magnitude correction signal for said local oscillator in response to said error signal.

2. The received signal tracking means in claim 1 wherein said tuning control means includes a tuning capacitor for developing a tuning voltage and voltage means for charging and discharging said capacitor.

3. The received signal tracking means in claim 2 wherein said detector means develops positive and negative polarity error signals dependent upon whether the frequency of said IF signal is above or below said reference frequency.

4. The received signal tracking means of claim 3 wherein said voltage means include an electrical power source and sink and corresponding transmission gates coupled between said source and sink and said tuning capacitor, respectively; one of said transmission gates responding to said negative polarity error signals and the other transmission gate responding to said positive polarity error signals.

5. The received signal tracking means of claim 4 wherein said source and said sink are equal electrical current capacity to provide a constant current correction to said tuning capacitor regardless of the magnitude and polarity of said error signals.

6. The received signal tracking means of claim 5 wherein said transmission gates are activated only when said frequency difference between said IF signal and said reference frequency is greater than a predetermined amount.

7. In a television tuning system of the type including tuning control means supplying tuning voltage to a local oscillator in response to signal-independent tuning means, mixing means mixing the local oscillator signal with a received television signal to derive an intermediate frequency signal and signal tracking automatic frequency control means producing an error signal as a function of frequency difference between said intermediate frequency signal and a reference frequency, the improvement in said automatic frequency control means comprising:
    means in said tuning control means for incrementally changing said tuning voltage to reduce said error signal in a non-proportionate manner, said means being disabled when the frequency difference between said IF signal and said reference frequency is less than a predetermined threshold value.

* * * * *